(12) United States Patent
Ohashi et al.

(10) Patent No.: US 7,701,237 B2
(45) Date of Patent: Apr. 20, 2010

(54) SEMICONDUCTOR INTEGRATED CIRCUIT DEVICE, METHOD OF TESTING SEMICONDUCTOR INTEGRATED CIRCUIT DEVICE, AND PROBE CARD USED FOR BURN-IN STRESS AND D/S TESTS

(75) Inventors: Masanobu Ohashi, Yokohama (JP); Yoshio Kaneko, Kashiwa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/199,185

(22) Filed: Aug. 27, 2008

(65) Prior Publication Data
US 2009/0058443 A1 Mar. 5, 2009

(30) Foreign Application Priority Data
Aug. 31, 2007 (JP) ............................. 2007-227002

(51) Int. Cl.
*G01R 31/02* (2006.01)
(52) U.S. Cl. ...................... 324/760; 324/763; 257/48
(58) Field of Classification Search ............... 324/760, 324/763, 765; 714/733–734; 257/48; 219/209
See application file for complete search history.

(56) References Cited

U.S. PATENT DOCUMENTS

| 5,982,189 | A | * | 11/1999 | Motika et al. | ............... | 324/763 |
| 6,326,800 | B1 | * | 12/2001 | Kirihata | ............... | 324/760 |
| 2006/0113535 | A1 | | 6/2006 | Lunde | | |
| 2008/0231306 | A1 | * | 9/2008 | Maggi et al. | ............... | 324/763 |

FOREIGN PATENT DOCUMENTS

| JP | 11-083939 | 3/1999 |
| JP | 2006084472 | 3/2006 |

OTHER PUBLICATIONS

Japanese Office Action for 2007-227002 mailed on December 18, 2009.

\* cited by examiner

*Primary Examiner*—Ha Tran T Nguyen
*Assistant Examiner*—Arleen M Vazquez
(74) *Attorney, Agent, or Firm*—Turocy & Watson, LLP (57) ABSTRACT

According to one embodiment of the invention, a semiconductor chip includes: a test target circuit to which a given burn-in stress is applied; and a burn-in counter that is configured: to acquire a first parameter indicating a test voltage applied to the test target circuit and a second parameter indicating a temperature of the test target circuit; to estimate the given burn-in stress from the first parameter and the second parameter; and to output burn-in stress information corresponding to the estimated burn-in stress.

10 Claims, 7 Drawing Sheets

SEMICONDUCTOR INTEGRATED CIRCUIT DEVICE, METHOD OF TESTING SEMICONDUCTOR INTEGRATED CIRCUIT DEVICE, AND PROBE CARD USED FOR BURN-IN STRESS AND D/S TESTS

CROSS-REFERENCE TO RELATED APPLICATIONS

This application claims priority from Japanese Patent Application 2007-227002, filed Aug. 31, 2007, the entire contents of which are incorporated herein by reference.

BACKGROUND OF THE INVENTION

1. Technical Field

The present invention relates to burn-in technology needed for reducing the early failure rate of semiconductor integrated circuit devices.

2. Description of the Related Art

In semiconductor integrated circuit devices (LSIs) such as memories and logics, as a technique for reducing the early failure rate (EFR), burn-in is performed for a sample that has been molded and sealed with a resin under a high temperature and a high voltage (for example, see JP-A-H11-83939).

However, in the burn-in process disclosed in page no. 6, FIG. 1 of JP-A-H11-83939, the burn-in stress applied to the sample cannot be acquired, and excessive burn-in stress may be applied. In addition, a dedicated part such as a burn-in board or a burn-in socket may be needed.

SUMMARY OF THE INVENTION

According to an aspect of the invention, there is provided a semiconductor chip including: a test target circuit to which a given burn-in stress is applied; and a burn-in counter that is configured: to acquire a first parameter indicating a test voltage applied to the test target circuit and a second parameter indicating a temperature of the test target circuit;

According to another aspect of the invention, there is provided a method of testing a first semiconductor chip to be performed a die sort (D/S) test and a second semiconductor chip to be applied a burn-in stress simultaneously with the D/S test of the first semiconductor chip by using a probe card having first proves and second proves, the second semiconductor chip having a burn-in counter that stores degree of burn-in stress, the method including: bringing the first probes into contact with terminals of the first semiconductor chip previously performed burn-in test; bringing the second probes into contact with a power source terminal, a ground terminal, and burn-in I/O terminals of the second semiconductor chip; performing a D/S test on the first semiconductor chip by applying a source voltage to a power source terminal of the first semiconductor chip; and applying the burn-in stress to the second semiconductor chip by applying a test voltage that is higher than the power source voltage to the power source terminal of the second semiconductor chip, wherein the both bringing steps are performed simultaneously, and wherein the performing step is performed simultaneously with the applying step.

DETAILED DESCRIPTION OF EXEMPLARY EMBODIMENTS OF THE INVENTION

Hereinafter, embodiments of the present invention will be described with reference to the accompanying drawings

Embodiment 1

Figure 1:
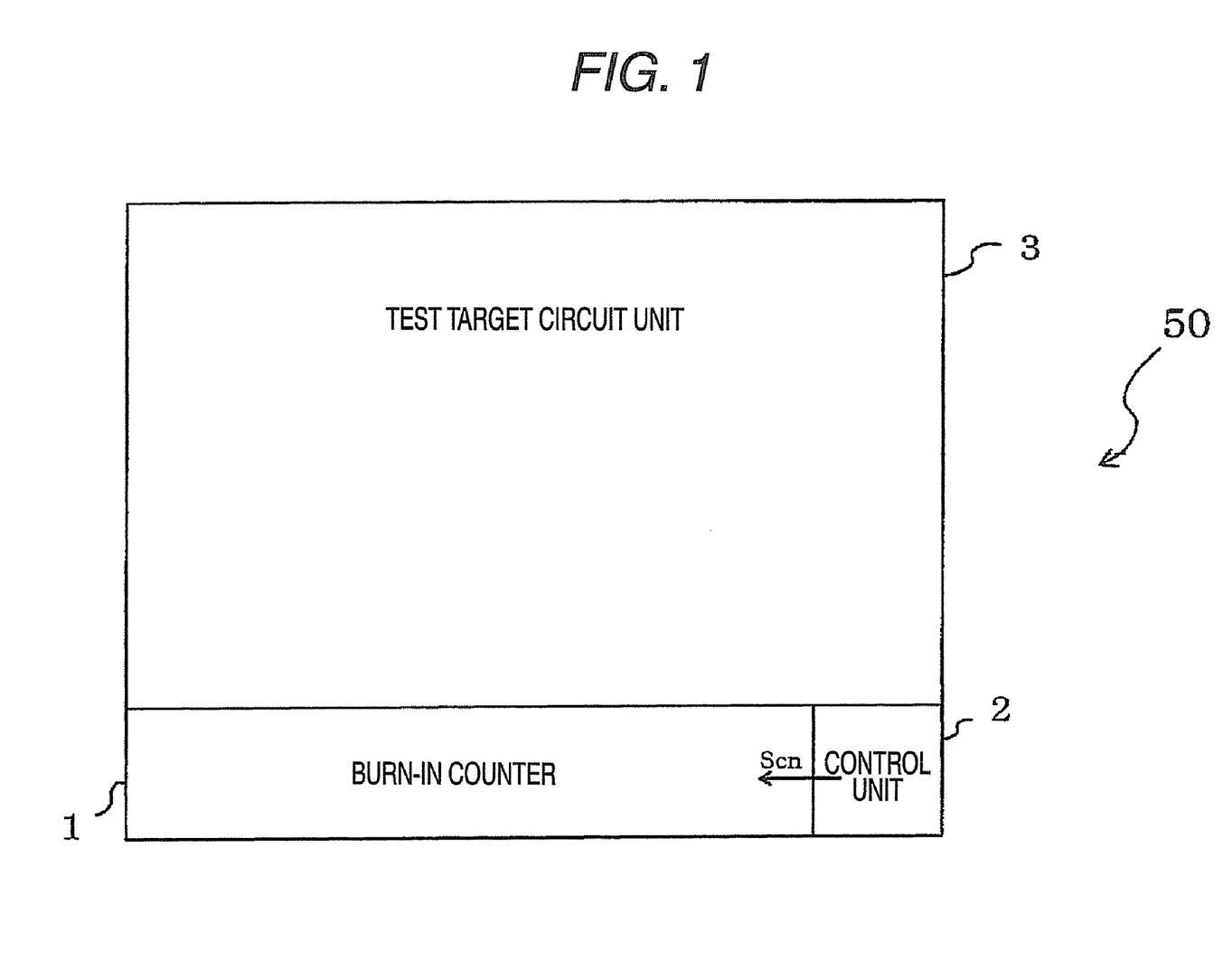
FIG. 1 is a block diagram showing a semiconductor integrated circuit device according to exemplary embodiment 1.
Figure 2:
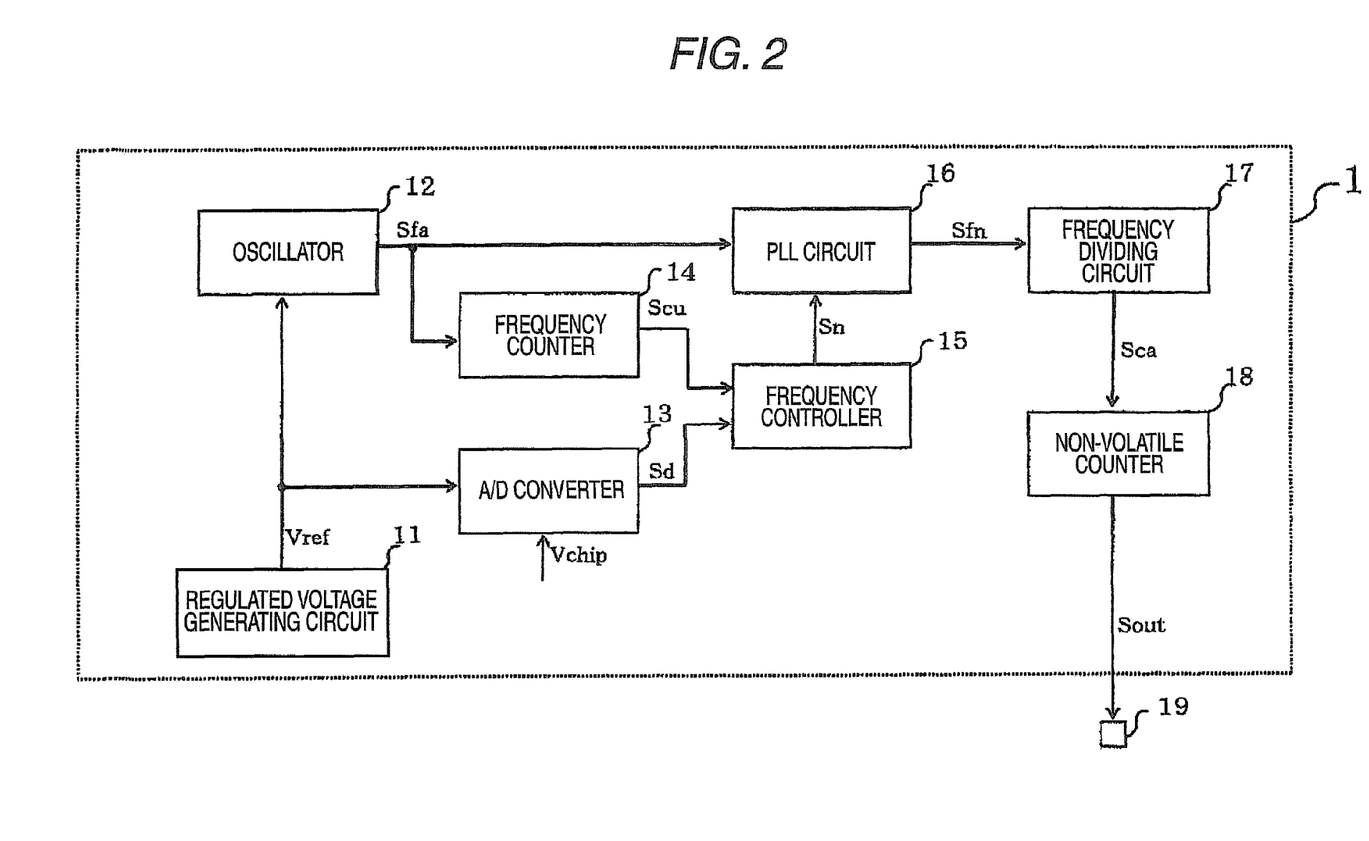
FIG. 2 is a block diagram showing a burn-in counter according to exemplary embodiment 1.
Figure 3:
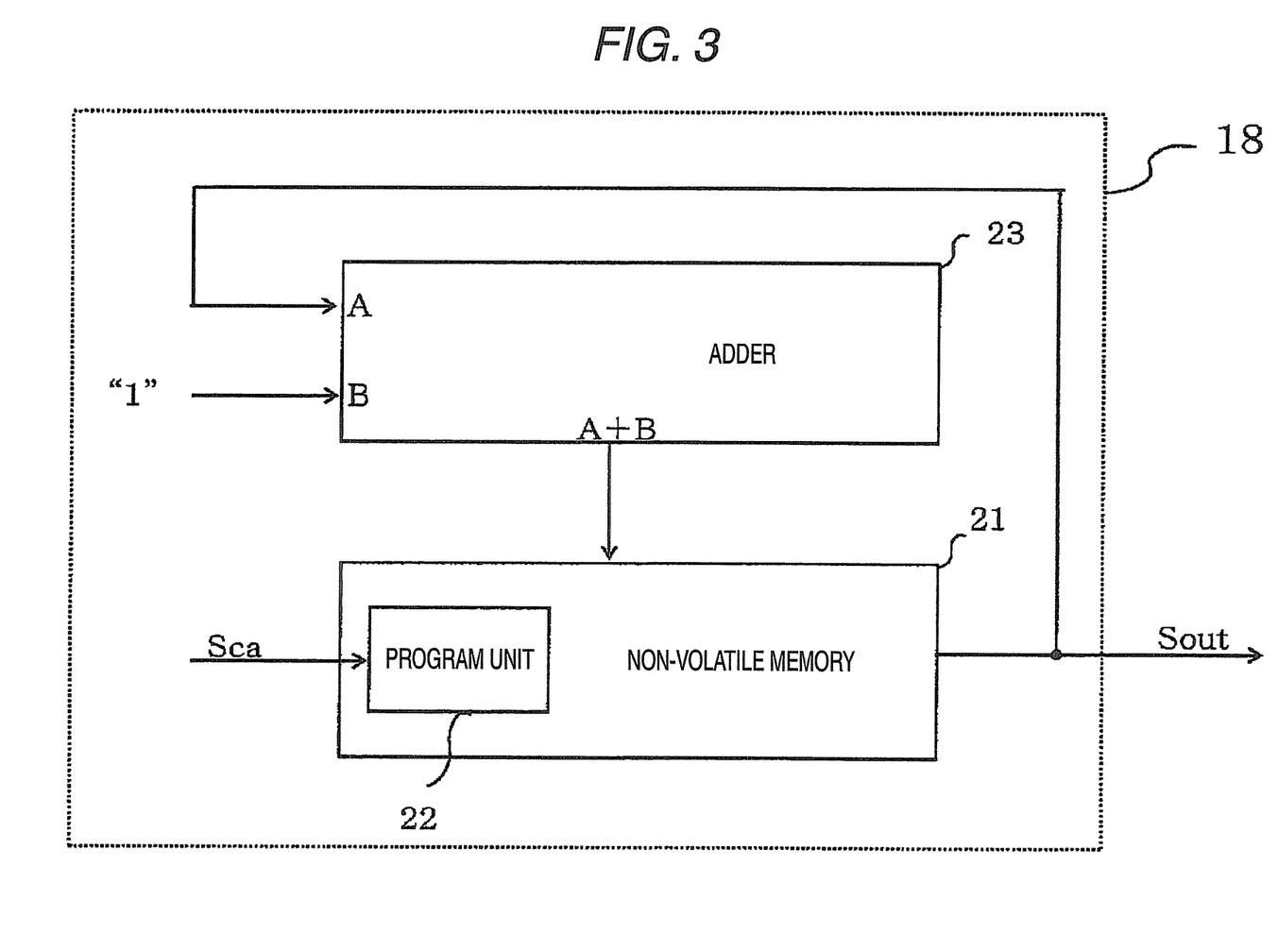
FIG. 3 is a block diagram showing a non-volatile counter according to exemplary embodiment 1.

First, a semiconductor integrated circuit device according to Embodiment 1 of the present invention will be described with reference to drawings. FIG. 1 is a block diagram showing the semiconductor integrated circuit device. FIG. 2 is a block diagram showing a burn-in counter. FIG. 3 is a block diagram showing a non-volatile counter. In this embodiment, a burn-in counter is mounted on the semiconductor integrated circuit device.

As shown in FIG. 1, the semiconductor integrated circuit device 50 includes a burn-in counter 1, a control unit 2, and a test target circuit unit 3. To the semiconductor integrated circuit device 50, burn-in stress is applied so as to reduce the early failure rate (EFR) (for the purpose of suppressing generation of a market failure) before a D/S test or after a resin sealing process.

The burn-in counter 1 is "on-chipped" on the semiconductor integrated circuit device 50 and is disposed so as to acquire burn-in stress applied to the test target circuit unit 3 as a semiconductor memory device. The burn-in counter 1 acquires the burn-in stress (an applied temperature and an applied voltage) applied to the test target circuit unit 3 and counts up (monitors) the burn-in stress, and outputs burn-in stress information corresponding to the applied temperature, the applied voltage, and a burn-in stress time period externally. By using the burn-in stress information, the burn-in stress time period for the test target circuit unit 3 can be optimized, and accordingly, the application of excessive burn-in stress to the test target circuit unit 3 can be prevented. The control unit 2 outputs a control signal Scn used for controlling the operation of the burn-in counter 1 to the burn-in counter 1.

The test target circuit unit 3 is, for example, a semiconductor memory device (a memory LSI). When the test target circuit unit 3 is in a wafer state or after the test target circuit unit 3 is sealed with a resin, the burn-in stress is applied to the test target circuit unit under a high temperature and a high voltage. Here, the high temperature means that Tj (a junction temperature) is higher than the room temperature of 25° C. In addition, the high voltage is, for example, is a voltage higher than the voltage applied to the test target circuit unit 3 by the wafer D/S test.

As shown in FIG. 2, in the burn-in counter 1, a regulated voltage generating circuit 11, an oscillator 12, an A/D converter 13, a frequency counter 14, a frequency controller 15, a PLL circuit 16, a frequency dividing circuit 17, and a non-volatile counter 18 are provided.

The regulated voltage generating circuit 11 generates a reference voltage Vref and outputs the reference voltage to the oscillator 12 and the A/D converter 13. The regulated voltage generating circuit 11 is, for example, configured by a band gap reference circuit. The reference voltage Vref has a very small voltage coefficient and a very small temperature coefficient. Accordingly, even when the surrounding temperature of the semiconductor integrated circuit device 50 changes or the source voltage level that is supplied to the regulated voltage generating circuit 11 changes, the reference voltage Vref has a fixed voltage value all the time.

The oscillator 12 is disposed between the regulated voltage generating circuit 11 and both the frequency counter 14 and the PLL circuit 16. The oscillator 12 receives the reference voltage Vref and a chip application voltage Vchip as inputs, generates an oscillation signal Sfa having an oscillation frequency fa on the basis of a voltage difference between the reference voltage Vref and the chip application voltage Vchip, and outputs the oscillation signal Sfa to the frequency counter 14 and the PLL circuit 16.

Here, the chip application voltage Vchip is a voltage applied to the test target circuit unit 3 in the burn-in process. As the oscillator 12, for example, a ring oscillator is used. The reference voltage Vref is supplied to the ring oscillator as a power source. The ring oscillator has an odd number of a plurality of inverter connected in series and an output of the inverter in the final stage of the serial path is input to the inverter in the first stage of the serial path. The ring oscillator decreases its oscillation frequency fa as the surrounding temperature increases. On the other hand, the ring oscillator increases its oscillation frequency fa as a voltage of the power source increases. Oscillation frequency fa is calculable from the voltage of the power source and the surrounded temperature. In FIG. 2, Oscillation frequency fa varies in accordance with varying of the surrounded temperature, because the reference voltage Vref supplied to the ring oscillator as the power source is constant value.

Accordingly, the oscillator 12 using the ring oscillator 12 may be used as a temperature sensor. In other words, the temperature Tj (junction temperature) of the semiconductor integrated circuit device 50 (the test target circuit unit 3) is calculable from information of the oscillation frequency fa.

When the burn-in stress is applied to the test target circuit unit 3, the temperature of the test target circuit unit 3 slowly increases from the room temperature to reach Tj (the junction temperature) after a predetermined time t1 elapses. The oscillation frequency fa output from the oscillator 12 is relatively high at the start of application of the burn-in stress (the room temperature), and is relatively low at Tj (the junction temperature) after elapse of the predetermined time t1. The output signal Sout that is output from the burn-in counter 1 changes based on the oscillation frequency fa. Accordingly, it is preferable that the chip application voltage Vchip that is to be input to the oscillator 12 is supplied to the oscillator 12 at a time point when the temperature of the target test circuit unit 3 increases to reach Tj (the junction temperature) after elapse of the predetermined time t1.

The A/D converter 13 is disposed between the regulated voltage generating circuit 11 and the frequency controller 15. To the A/D converter 13, the reference voltage Vref output from the regulated voltage generating circuit 11 and the chip application voltage Vchip are input, and the A/D converter outputs a digital conversion signal Sd, which is acquired by converting a difference (voltage difference) between the reference voltage Vref and the chip application voltage Vchip from analog to digital, to the frequency controller 15.

The frequency counter 14 is disposed between the oscillator 12 and the frequency controller 15. To the frequency counter 14, an oscillation signal Sfa output from the oscillator 12 is input. Then, the frequency counter 14 performs a count-up operation in accordance with the oscillation frequency fa and outputs a count-up signal Scu to the frequency controller 15.

In the frequency controller 15, a ROM is provided. The frequency controller 15 is disposed between both the frequency counter 14 and the A/D converter 13 and the PLL circuit 16. To the frequency controller, the count-up signal Scu output from the frequency counter 14 and the digital conversion signal Sd output from the A/D converter 13 are input. Then, the frequency controller 15 generates a frequency multiplication signal Sn used for controlling a frequency and outputs the frequency multiplication signal to the PLL circuit 16. Here, the frequency multiplication signal Sn is a frequency indication value (a frequency multiplication value) corresponding to the temperature and the voltage level which are applied to the test target circuit unit 3. In the frequency controller 15, burn-in acceleration coefficient information corresponding to the temperature and the voltage level on the basis of the specification of the semiconductor integrated circuit device 50 is calculated in advance, and the frequency indication value is recorded at a ROM address.

The PLL circuit 16 is disposed between both the oscillator 12 and the frequency controller 15 and the frequency dividing circuit 17. To the PLL circuit, the oscillation signal Sfa output from the oscillator 12 and the frequency multiplication signal Sn output from the frequency controller 15 are input. The PLL circuit 16 generates a multiple-frequency signal Sfn having a multiple-frequency fn that is acquired by performing a frequency multiplication for the oscillation frequency fa and outputs the multiple-frequency signal to the frequency dividing circuit 17.

The frequency dividing circuit 17 is disposed between the PLL circuit 16 and the non-volatile counter 18. To the frequency dividing circuit, the multiple-frequency signal Sfn output from the PLL circuit 16 is input. Then, the frequency dividing circuit 17 outputs a carry signal Sca that is generated based on the multiple-frequency signal Sfn to the non-volatile counter 18.

The non-volatile counter 18 is disposed between the frequency dividing circuit 17 and an output terminal 19. To the non-volatile counter, the carry signal Sca output from the frequency dividing circuit 17 is input. The non-volatile counter 18 performs a count-up operation every time the carry signal Sca is input and outputs the count-up signal Scu to the output terminal 19 that is disposed outside the burn-in counter 1. The count-up signal Scu is output outside the semiconductor integrated circuit device 50 through the output terminal 19. By using the count-up signal Scu, a time period for which the burn-in stress is applied to the test target circuit unit 3 can be optimized. Accordingly, it can be prevented that excessive burn-in stress is applied to the test target circuit unit 3.

As shown in FIG. 3, in the non-volatile counter 18, a non-volatile memory 21 and an adder 23 are provided. As the non-volatile memory 21, for example, an EEPROM (Electrically Erasable and Programmable Read Only Memory) that stores input information in a non-volatile manner is used. In the non-volatile memory 21, a program unit 22 is provided. To the program unit 22 of the non-volatile memory 21, the carry signal Sca is input. The non-volatile memory 21, for example, detects a rising edge of the carry signal Sca, stores rising edge information as "1", outputs the rising edge information to the adder 23, and outputs the rising edge information as an output signal Sout.

The adder 23 receives the rising edge information of "1" output from the non-volatile memory 21 as input and returns information of "2" that is acquired by adding one to the rising edge information to the non-volatile memory 21.

The returned information of "2" is stored in the non-volatile memory 21. When the carry signal Sca is input to the non-volatile memory 21, the information of "2" output from the adder 23 is output from the non-volatile memory 21. The output information of "2" is output as the output signal Sout, one is added thereto by the adder 23, and information of "3" is returned to the non-volatile memory 21. Thereafter, every time the carry signal Sca is input, an output signal counted up from the information of the non-volatile memory 21 is output from the non-volatile memory 18.

As described above, in the semiconductor integrated circuit device according to this embodiment, the burn-in counter 1, the control unit 2, and the test target circuit unit 3 are provided. To the test target circuit unit 3, burn-in stress is applied. The control unit 2 controls the burn-in counter 1. In the burn-in counter 1, the regulated voltage generating circuit 11, the oscillator 12, the A/D converter 13, the frequency counter 14, the frequency controller 15, the PLL circuit 16, the frequency dividing circuit 17, and the non-volatile counter 18 are provided. The burn-in counter 1 is on-chipped on the semiconductor integrated circuit device 50 and is provided for acquiring the burn-in stress applied to the test target circuit unit 3 as a semiconductor memory device. The burn-in counter 1 acquires the burn-in stress information (the applied temperature and the applied voltage) that is applied to the test target circuit unit 3, counts up (monitors) the burn-in stress, and outputs burn-in stress information corresponding to the applied temperature, the applied voltage, and the burn-in stress time period externally.

Accordingly, the burn-in stress applied to the test target circuit unit 3 in the wafer state or after a resin sealing process can be acquired, and thereby application of excessive burn-in stress to the test target circuit unit 3 can be prevented.

Although the control unit 2 is disposed in the semiconductor integrated circuit device 50 in this embodiment, the control unit may be disposed inside the burn-in counter 1 or the test target circuit unit 3 or disposed outside the semiconductor integrated circuit device 50.

Embodiment 2

Figure 4:
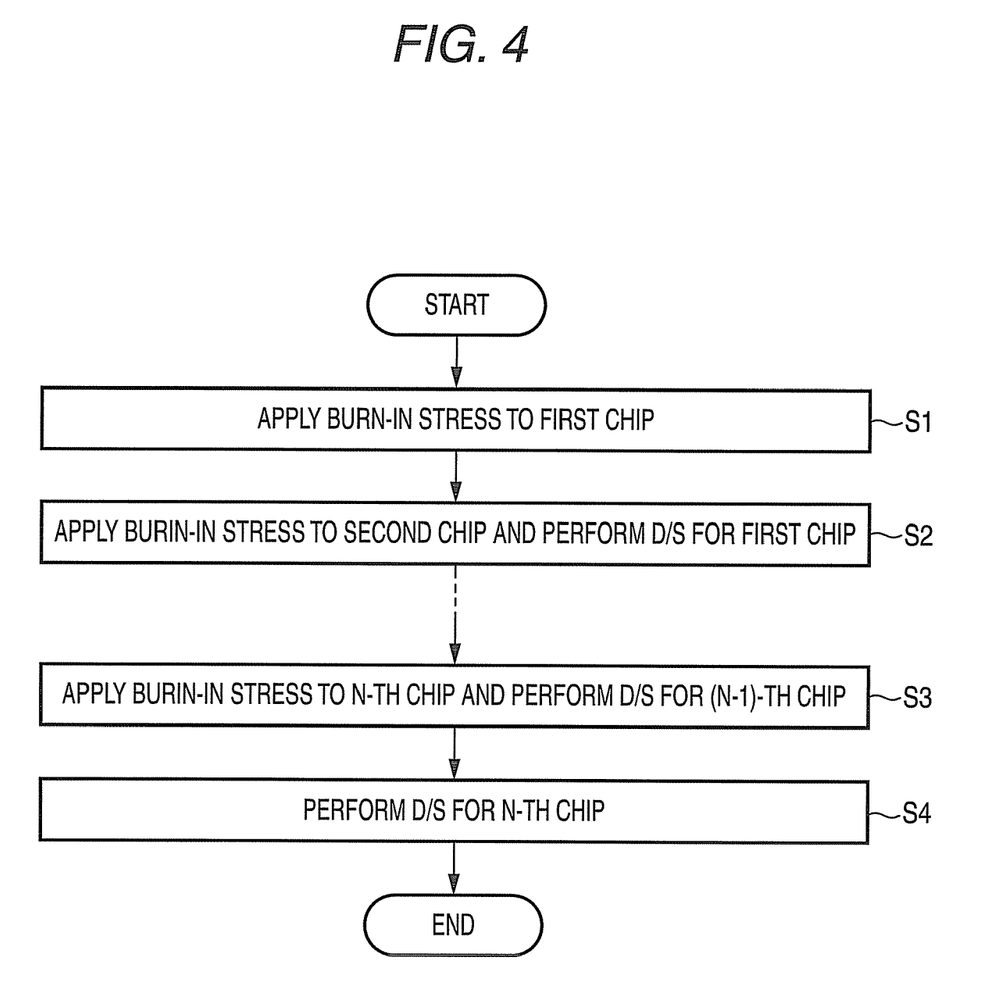
FIG. 4 is a flowchart showing a process for burn-in stress and D/S tests according to exemplary embodiment 2.
Figure 5:
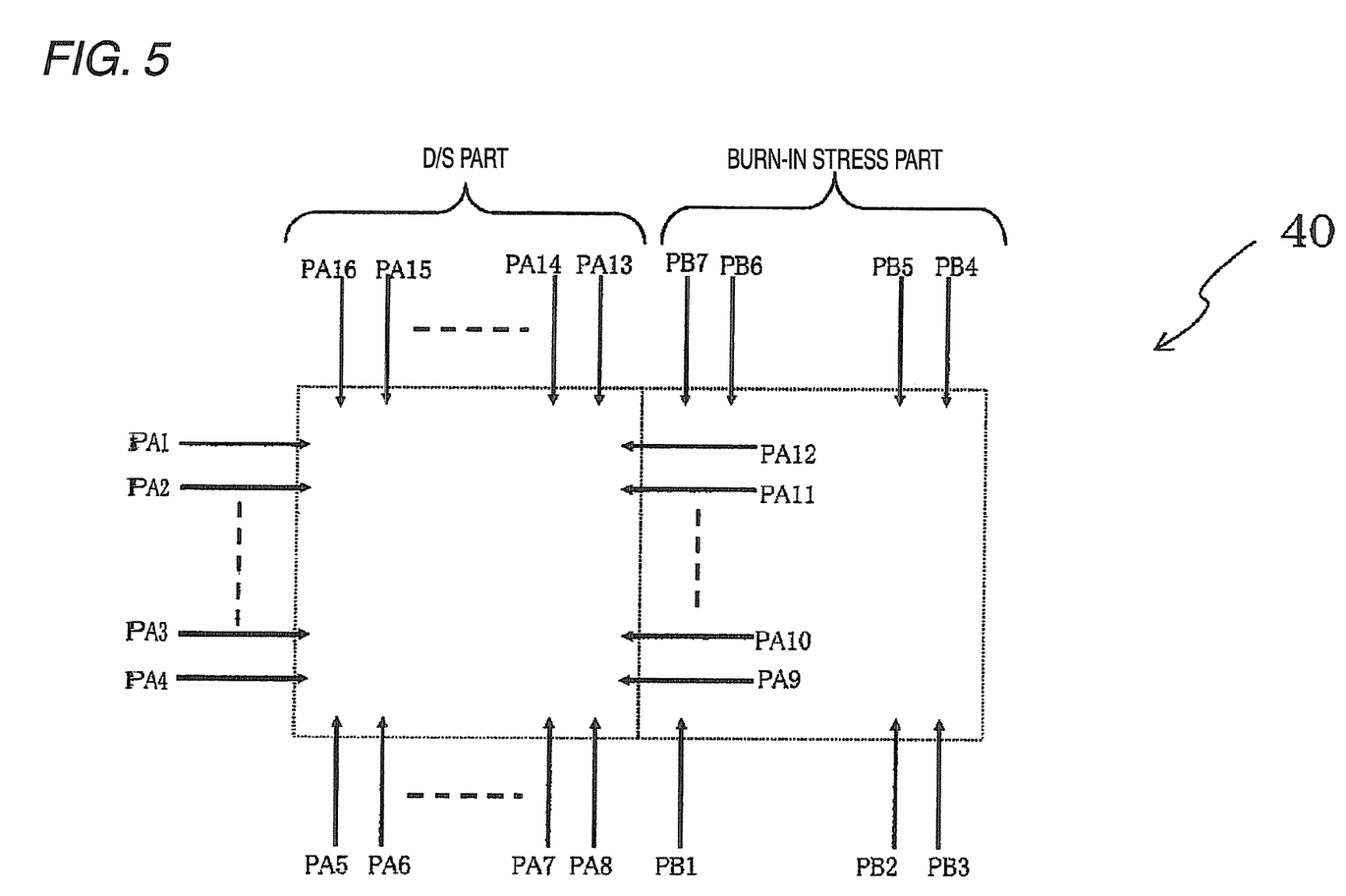
FIG. 5 is a schematic diagram showing a probe card used in the burn-in stress and D/S tests according to exemplary embodiment 2.
Figure 6:
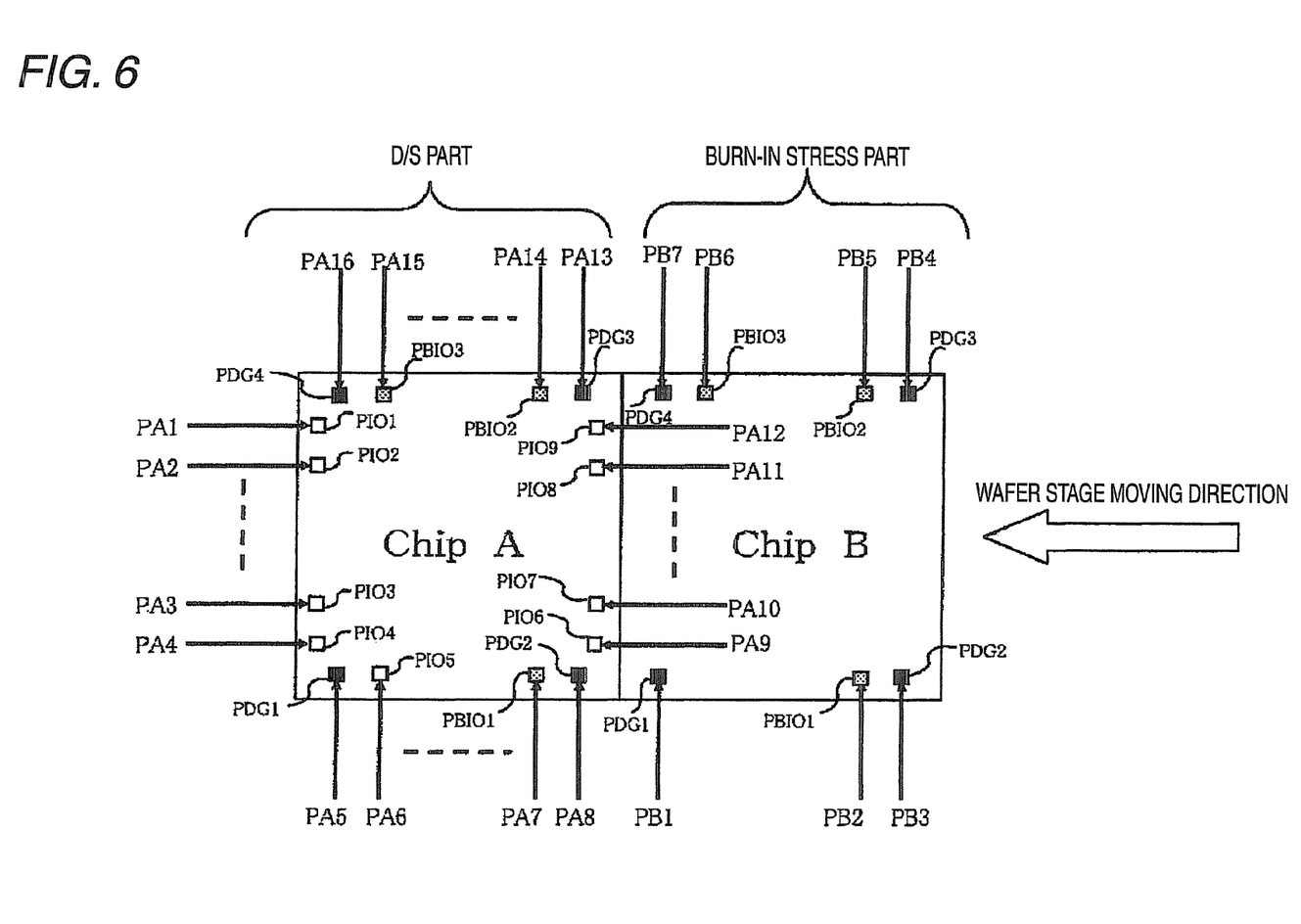
FIG. 6 is a schematic diagram showing the burn-in stress and D/S tests according to exemplary embodiment 2.

Next, a semiconductor integrated circuit device according to Embodiment 2 of the present invention, a method of testing the semiconductor integrated circuit device, and a probe card used for the burn-in stress and D/S tests will be described with reference to drawings. FIG. 4 is a flowchart showing a process for the burn-in stress and D/S tests. FIG. 5 is a schematic diagram showing a probe card used for the burn-in stress and D/S tests. FIG. 6 is a schematic diagram showing the burn-in stress and D/S tests.

In this embodiment, the application of the burn-in stress and the D/S for the semiconductor integrated circuit device according to Embodiment 1 are simultaneously performed by using the probe card.

As shown in FIG. 4, for a wafer on which production of the semiconductor integrated circuit device 50 having the burn-in counter 1 mounted thereon is completed, the burn-in stress and D/S tests are performed independently and simultaneously by using a probe card 40 corresponding to the burn-in stress and the D/S.

Here, it is preferable that the time period for application of the burn-in stress is set to a time within a D/S test time period and the chip application voltage Vchip is set to a value for reducing the early failure rate (EFR) to a predetermined failure rate. The burn-in stress information is stored in the burn-in counter 1 that is built in each chip. Here, burn-in stress and D/S tests for the first column part of the wafer are performed.

First, burn-in stress (not shown) is applied to a first chip (Chip A) of the first column part of the wafer by using the probe card 40. Here, the D/S test is not performed for any chip. In addition, as shown in FIG. 5, in the probe card 40, probes PA1 to PA16 and probes PB1 to PB7 are provided. The probes PA1 to PA16 correspond to the D/S test, and the probes PB1 to PB7 correspond to the burn-in stress test. The layout of the probes PA1 to PA16 is arranged to be able to correspond to all terminals of the semiconductor integrated circuit device 50 chip. The layout of the probes PB1 to PB7 is arranged to be able to correspond to an adjacent chip on the right side of a chip for which the D/S test is performed (Step S1).

Next, application of the burn-in stress is to a second chip (Chip B) is performed simultaneously with performing the D/S test for the first chip (Chip A) to which the burn-in stress is applied.

In particular, as shown in FIG. 6, for Chip A for which the D/S test is performed, for example, the probes are brought into contact with all the terminals. In particular, probe PA5 is brought into contact with power source terminal PDG1, probe PA8 is brought into contact with power source terminal PDG2, probe PA13 is brought into contact with ground terminal PDG3, and probe PA16 is brought into contact with ground terminal PDG4. In addition, probe PA1 is brought into contact with I/O terminal PIO1, probe PA2 is brought into contact with I/O terminal PIO2, probe PA3 is brought into contact with I/O terminal PIO3, probe PA4 is brought into contact with I/O terminal PIO4, probe PA6 is brought into contact with I/O terminal PIO5, probe PA9 is brought into contact with I/O terminal PIO6, probe PA10 is brought into contact with I/O terminal PIO7, probe PA11 is brought into contact with I/O terminal PIO8, and probe PA12 is brought into contact with I/O terminal PIO9. In addition, probe PA7 is brought into contact with burn-in terminal PBIO1, probe PA14 is brought into contact with burn-in terminal PBIO2, and probe PA15 is brought into contact with burn-in terminal PBIO3.

The condition for the D/S test is set such that, for example, an operation certified voltage of 1.6 V is applied to the power source terminal as a power source voltage, the surrounding environment is heated (for example, a wafer stage is heated), and Chip A for which the D/S test is performed becomes a maximum junction temperature (certified temperature), for example, of Tj=125° C. When the burn-in terminals PBIO1 to PBIO3 are in a floating state, circuits relating to the burn-in terminals PBIO1 to PBIO3 may be unstable. Accordingly, the reason that the probes are brought into contact with the burn-in terminals PBIO1 to PBIO3 is for setting the burn-in terminals PBIO1 to PBIO3 to arbitrary electric potentials.

For Chip B to which the burn-in stress is applied, probes are brought into contact with only terminals needed for burn-in stress (a power source terminal, a ground terminal, and burn-in I/O terminals). For example, probe PB1 is brought into contact with power source terminal PDG1, probe PB3 is brought into contact with power source terminal PDG2, probe PB4 is brought into contact with ground terminal PDG3, and probe PB7 is brought into contact with ground terminal PDG4. In addition, probe PB2 is brought into contact with burn-in terminal PBIO1, probe PB5 is brought into contact with burn-in terminal PBIO2, and probe PB6 is brought into contact with burn-in terminal PBIO3.

The condition for the burn-in stress is that a voltage value of, for example, 2.5 V that is higher than the operation certified voltage of the product is applied to power source terminals as the chip application voltage Vchip. By setting the voltage as described above, a temperature higher than the maximum junction temperature (certified temperature) of the product is set to the chip for which the burn-in stress is applied. The temperature of Chip B to which the burn-in stress is applied is monitored by the burn-in counter 1. Here, since the burn-in stress is applied by using probes of the minimum number which are required, it is possible to achieve current consumption lower than that for the D/S test. In addition, extra tester channels can be used, and accordingly, there is no affect on the test time period of the D/S test and the unit cost for the D/S test (Step S2).

Subsequently, the burn-in stress and D/S tests are sequentially performed independently and simultaneously, and the application of the burn-in stress to the last N-th chip of the first column part of the wafer and the D/S test for the (N−1)-th chip are performed (Step S3).

Then, the D/S test for the last N-th chip of the first column part of the wafer is performed. At this moment, the burn-in stress is not applied to any chip (Step S4).

Next, in a same step for the second column part of the wafer 2 and a column thereafter, the burn-in stress and D/S tests are performed, and then, the burn-in stress and D/S tests for a wafer or a specific lot are completed. Here, although the burn-in stress and D/S tests are sequentially performed in the column direction of the wafer, the burn-in stress and D/S tests may be sequentially performed in the row direction of the wafer.

As described above, in the semiconductor integrated circuit device, a method of testing the semiconductor integrated circuit device, and the probe card 40 according to this embodiment, probes PA1 to PA16 and probes PB1 to PB7 are provided. Probes PA1 to PA16 correspond to the D/S test, and probes PB1 to PB7 correspond to the burn-in stress. For a wafer on which production of the semiconductor integrated circuit device 50 having the burn-in counter 1 mounted thereon is completed, the burn-in stress and D/S tests are performed independently and simultaneously by using a probe card 40 corresponding to the burn-in stress and the D/S tests. The burn-in counter 1 monitors the burn-in stress information of the test target circuit unit 3 to which the burn-in stress is applied and outputs the burn-in stress information externally.

Accordingly, application of excessive burn-in stress to the wafer chip can be prevented. In addition, the burn-in stress is applied by using probes of the minimum number which are required, and accordingly, current consumption lower than that of the D/S test can be achieved. In addition, since extra tester channels can be used, there is no affect on the test time period for the D/S test and the unit cost for the D/S test.

In addition, in this embodiment, although the burn-in stress and D/S tests are simultaneously performed, however, the condition (the applied voltage) for the burn-in stress may be changed in a burn-in stress test after a resin sealing process. The reason is that the chip is sealed with the resin and the temperature of junction changes. In addition, although the burn-in stress and D/S tests are simultaneously performed by mounting the burn-in counter 1 on the semiconductor integrated circuit device 50 in this embodiment, however, the burn-in stress and D/S tests may be performed independently and simultaneously by removing the burn-in counter.

Embodiment 3

Figure 7:
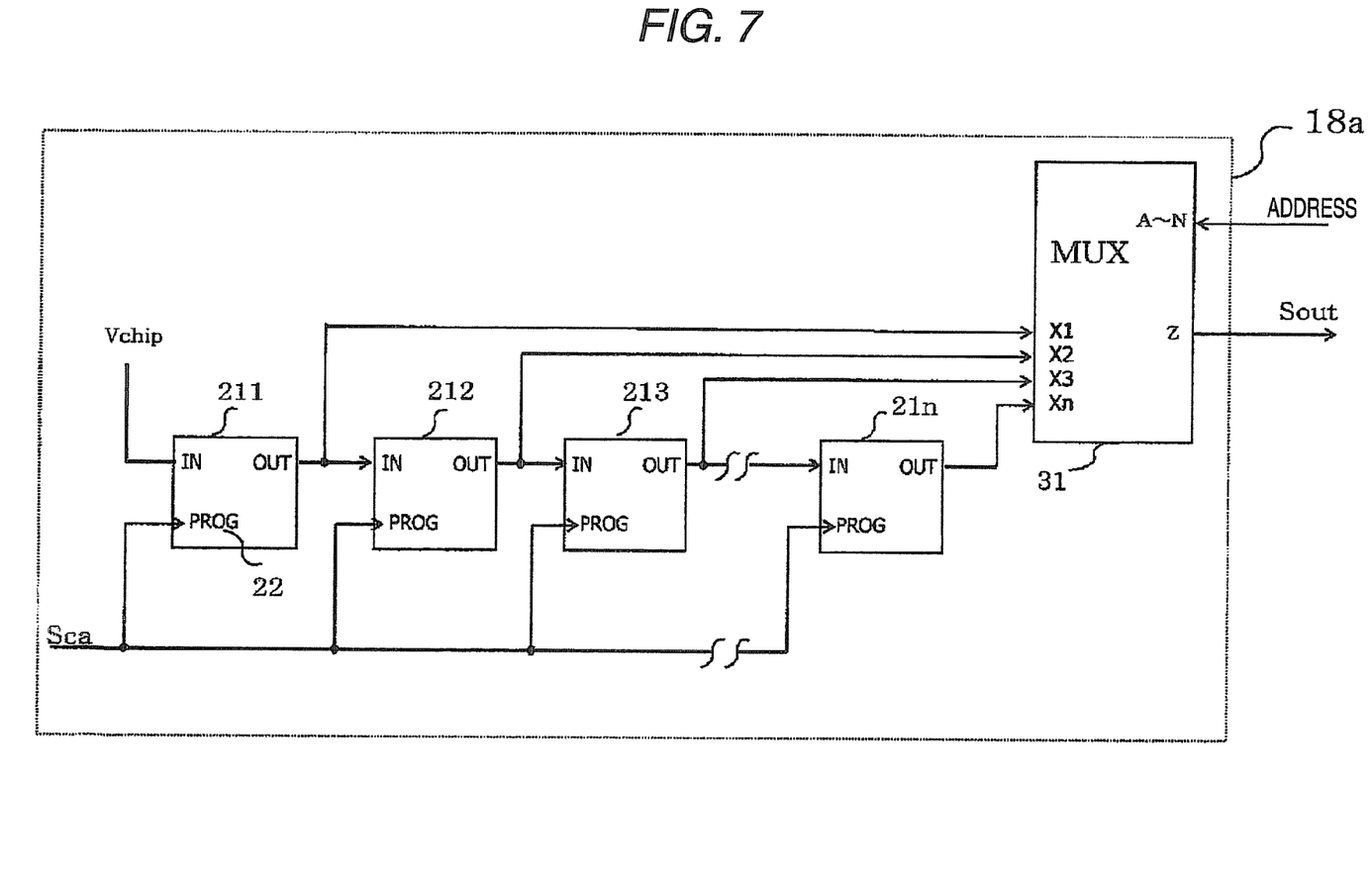
FIG. 7 is a block diagram showing a non-volatile counter according to exemplary embodiment 3.

Next, a semiconductor integrated circuit device according to Embodiment 3 of the present invention will be described with reference to drawings. FIG. 7 is a block diagram showing a non-volatile counter. In this embodiment, in order to acquire the status of the burn-in stress, a plurality of non-volatile memories is disposed inside a non-volatile counter.

As shown in FIG. 7, in a non-volatile counter 18a configuring the burn-in counter, a non-volatile memory 211, a non-volatile memory 212, a non-volatile memory 213, a non-volatile memory 21n, and a multiplexer 31 are provided. The non-volatile counter 18a has n non-volatile memories. The non-volatile memories 211 to 21n are, for example, EEPROMs (Electrically Erasable and Programmable Read Only Memories) that store input information in a non-volatile manner. In the non-volatile memories 211 to 21n, program units 22 are provided. The program units 22 have their initial values as "0"s and configures the structure of a shift register. Here, the burn-in counter in which the non-volatile counter 18a is disposed has a same configuration as that of Embodiment 1, except for the non-volatile counter 18a. PROM (Programmable Read Only Memory), EPROM (Erasable Programmable Read Only Memory), Fuse ROM (Fuse Read Only Memory) or OTP (One Time PROM) also may operate as the non-volatile memories 211 to 21n.

The input port IN of the non-volatile memory 211 is connected to the chip application voltage Vchip, and a carry signal Sca is input to the program unit 22 of the non-volatile memory 211. In addition, an output signal is output from the output port OUT of the non-volatile memory 211 to the input port IN of the non-volatile memory 212 and the input port X1 of the multiplexer 31.

The input port IN of the non-volatile memory 212 is connected to the output port OUT of the non-volatile memory 211. The carry signal Sca is input to the program unit 22 of the non-volatile memory 212, and an output signal is output from the output port OUT of the non-volatile memory 212 to the input port IN of the non-volatile memory 213 and the input port X2 of the multiplexer 31.

The input port IN of the non-volatile memory 213 is connected to the output port OUT of the non-volatile memory 212. The carry signal Sca is input to the program unit 22 of the non-volatile memory 213, and an output signal is output from the output port OUT of the non-volatile memory 213 to the input port IN of the fourth non-volatile memory not shown in the figure and the input port X3 of the multiplexer 31.

The input port IN of the non-volatile memory 21n is connected to the output port OUT of the (n−1)-th non-volatile memory not shown in the figure. A carry signal Sca is input to the program unit 22 of the non-volatile memory 21n, and an output signal is output from the output port OUT of the non-volatile memory 21n to the input port Xn of the multiplexer 31.

Signals output from the non-volatile memories 211 to 21n are input to input ports X1 to Xn of the multiplexer 31, and address information is input to the multiplexer so as to output an output signal Sout.

Here, first, when the carry signal Sca is input, the first non-volatile memory 211, for example, detects a rising edge of the carry signal Sca, stores rising edge information as "1", and the rising edge information is output to the input port IN of the non-volatile memory 212 and the input port X1 of the multiplexer 31.

Next, when the carry signal Sca is input, the output data of the second non-volatile memory 212 becomes "1", and accordingly, the output data is output to the input port IN of the third non-volatile memory 213 and the input port X2 of the multiplexer 31. As described above, every time the carry signal Sca is input, the non-volatile memory that outputs data of "1" is shifted by one. As a result, by checking the uppermost bit that has been finally changed to "1", the burn-in stress can be acquired. Here, it is preferable that the number of non-volatile memories provided in the non-volatile counter 18a is appropriately set to an optimal number corresponding to the condition for the burn-in stress.

As described above, in the semiconductor integrated circuit device according to this embodiment, the burn-in counter, the control unit, and the test target circuit unit are provided. In the non-volatile counter 18a configuring the burn-in counter, the non-volatile memory 211, the non-volatile memory 212, the non-volatile memory 213, the non-volatile memory 21n, and the multiplexer 31 are provided. The non-volatile counter 18a has a structure of a shift register, and the burn-in stress can be acquired by checking the uppermost bit that has been changed to "1".

Accordingly, the burn-in stress that has been applied to the test target circuit unit in a wafer state or after a resin sealing process can be precisely acquired, and thereby application of excessive burn-in stress to the test target circuit unit 3 can be prevented.

The present invention is not limited to the above-described embodiments, and various changes may be made therein without departing from the gist of the present invention. For example, in the above-described embodiments, although the burn-in counter has been described to be mounted on the semiconductor memory device (the memory LSI), however, the burn-in counter may be mounted on a logic LSI, an SoC (System on a Chip), or the like.

The present invention may be implemented by the following configurations described in the additional descriptions.

There is provided a method of testing a semiconductor integrated circuit device in which a D/S test is performed for a first chip of the semiconductor integrated circuit device, in which a burn-in counter is built, simultaneously with applying burn-in stress to a second chip of the semiconductor integrated circuit device, by using a probe card. The method includes bringing probes of the probe card into contact with terminals of the first chip, to which the burn-in stress is applied, simultaneously with bringing the probes of the probe card into contact with a power source terminal, a ground terminal, and burn-in I/O terminals of the second chip; and performing a D/S test by applying a source voltage to a power source terminal of the first chip simultaneously with applying the burn-in stress to the second chip by applying a chip application voltage that is higher than the power source voltage to the power source terminal of the second chip and extracting the burn-in stress information stored in the burn-in counter.

In the method of testing a semiconductor integrated circuit device according to Additional Description 1, the burn-in counter includes: a regulated voltage generating circuit that generates a reference voltage; an oscillator that receives a chip application voltage applied to the test target circuit unit and the reference voltage as inputs, generates an oscillation signal having an oscillation frequency on the basis of a voltage difference between the chip application voltage and the reference voltage, and monitors the temperature of the test target circuit unit; an A/D converter that receives the reference voltage and the chip application voltage as inputs and generates a digital conversion signal that is acquired from converting the voltage difference between the reference voltage and the chip application voltage from analog to digital; a frequency counter that receives the oscillation signal as an input, counts up in accordance with the oscillation frequency, and generates a count-up signal; a frequency controller that receives the digital conversion signal and the count-up signal as inputs and generates a frequency multiplication signal that controls a frequency; a PLL circuit that receives the oscillation signal and the frequency multiplication signal as inputs and generates a multiple-frequency signal that is acquired from multiplying the oscillation frequency; a frequency dividing circuit that receives the multiple-frequency signal as an input and generates a carry signal based on the multiple-frequency signal; and a non-volatile counter that receives the carry signal as an input, counts up every time the carry signal is input, and outputs a count-up signal.

As described with reference to the embodiment, there is a provided a semiconductor integrated circuit device, a method of testing a semiconductor integrated circuit device, and a probe card used for burn-in stress and D/S tests which are capable of applying optimized burn-in stress to a sample by acquiring the burn-in stress of the sample.

According to the embodiment of the present invention, burn-in stress of a sample is acquired, and accordingly, there is provided a semiconductor integrated circuit device, a method of testing a semiconductor integrated circuit device, and a probe card used for burn-in stress and D/S tests which apply optimized burn-in stress to the sample.

What is claimed is:

1. A semiconductor chip comprising:
   a test target circuit to which a given burn-in stress is applied; and
   a burn-in counter; wherein said burn-in counter acquires a first parameter indicating a test voltage applied to the test target circuit and a second parameter indicating a temperature of the test target circuit;
   estimates the given burn-in stress from the first parameter and the second parameter; and
   outputs burn-in stress information corresponding to the estimated burn-in stress;
   wherein the burn-in counter includes:
   a constant voltage circuit that outputs a reference voltage; an oscillator that receives the reference voltage and generates an oscillation signal having an oscillation frequency that is varied according to the temperature of the test target circuit; a frequency counter that receives the oscillation signal and obtains the second parameter from the oscillation signal; an A/D converter that receives the reference voltage and the test voltage and obtains the first parameter from a voltage difference between the reference voltage and the test voltage; a frequency controller that receives the first parameter and the second parameter and generates a frequency multiplication signal; a PLL circuit that receives the oscillation signal and the frequency multiplication signal and generates a multiple-frequency signal by multiplying the oscillation frequency of the oscillation signal based on the frequency multiplication signal; a frequency divider that receives the multiple-frequency signal and generates a carry signal from the multiple-frequency signal; and a counter that receives the carry signal, counts up the number of times receiving the carry signal as the burn-in stress information and outputs the burn-in stress information.

2. The semiconductor chip according to claim 1,
   wherein the counter includes:
   a detection portion that detects a rising edge of the carry signal, and
   a counting portion that retains the burn-in stress information as a variable that is incremented by one at each time when the detection portion detects the rising edge.

3. The semiconductor chip according to claim 2,
   wherein the counting portion includes:
   a storing portion that stores the variable as an integer and outputs the variable, and an adder receives the variable output from the storing portion and adds one to the variable to output to the storing portion when the detection portion detects the rising edge; and wherein the storing portion stores the variable input from the adder.

4. The semiconductor chip according to claim 2, wherein the storing portion and the counting portion are formed in a non-volatile memory.

5. The semiconductor chip according to claim 1, wherein the counter includes:
a plurality of non-volatile memory that are connected to each other to form a shift register,
each non-volatile memory receives the carry signal and outputs a detection signal,
a multiplexer that receives a plurality of detection signal output from each non-volatile memory and selectively output the received detection signal.

6. The semiconductor chip according to claim 5,
wherein the plurality of non-volatile memories are EEPROM, PROM, EPROM, Fuse ROM or OTP.

7. The semiconductor chip according to claim 1, wherein the oscillator is a ring oscillator.

8. The semiconductor chip according to claim 1, wherein the constant voltage circuit is a band gap reference circuit.

9. The semiconductor chip according to claim 1,
wherein the frequency controller includes a ROM storing a table to determine the frequency multiplication signal based on the first parameter and the second parameter.

10. The semiconductor chip according to claim 9,
wherein the table stored in the ROM is customized based on characteristics of the semiconductor chip.

* * * * *